United States Patent [19]

Kim

[11] Patent Number: 4,918,029

[45] Date of Patent: Apr. 17, 1990

[54] METHOD FOR LIQUID-PHASE THIN FILM EPITAXY

[75] Inventor: Ki-Joon Kim, Seoul, Rep. of Korea

[73] Assignee: Samsung Electronics Co., Ltd., Kyoungsangbuk, Rep. of Korea

[21] Appl. No.: 157,981

[22] Filed: Feb. 19, 1988

[30] Foreign Application Priority Data

Feb. 21, 1987 [KR]  Rep. of Korea ............ 1987-1489[U]

[51] Int. Cl.⁴ .................... H01L 21/20; H01L 21/208
[52] U.S. Cl. ................................. 437/119; 437/130; 437/133; 148/DIG. 101
[58] Field of Search ............... 437/119, 121, 126, 130, 437/127, 133; 148/DIG. 101; 156/621, 622, 623 R

[56] References Cited

U.S. PATENT DOCUMENTS

| | | | |
|---|---|---|---|
| 3,950,195 | 4/1976 | Rode et al. | 437/119 |
| 4,154,631 | 5/1979 | Schoolar | 437/84 |
| 4,347,097 | 8/1982 | Nishizawa | 156/622 |
| 4,357,897 | 11/1982 | Leswin | 437/119 |
| 4,465,527 | 8/1984 | Nishizawa | 437/119 |
| 4,565,156 | 1/1986 | Nishizawa et al. | 437/119 |

FOREIGN PATENT DOCUMENTS

| | | | |
|---|---|---|---|
| 0084457 | 7/1978 | Japan | 437/119 |
| 0083933 | 7/1981 | Japan | 437/119 |
| 0104122 | 6/1984 | Japan | 437/119 |
| 0136515 | 6/1988 | Japan | 437/119 |

Primary Examiner—Brian E. Hearn
Assistant Examiner—M. Wilczewski
Attorney, Agent, or Firm—Robert E. Bushnell

[57] ABSTRACT

A device and method for liquid-phase thin film epitaxial growth are disclosed wherein yield and quality of semiconductors in the fabrication sequences are improved. The device comprises an electric furnace which is disposed outside a quartz tube, a plurality of boats which are disposed within the quartz tube in accordance with a sort of melting liquids and a plurality of auxiliary heating devices are disposed around the boats with a power source independent from the electric furnace. According to this fabrication sequence, after heating the inner part of the quartz tube up to a first temperature level by supplying the power source to the electric furnace, the melting liquids are firstly melted down enough by means of selectively heating the auxiliary heating devices up to a second temperature level higher than the first temperature level, the substrates are then moved to be in contact with the melting liquids and an epitaxial growth layer is consequently formed through selectively reducing the temperature of the auxiliary heating devices to other levels different from the first and second level.

37 Claims, 3 Drawing Sheets

METHOD FOR LIQUID-PHASE THIN FILM EPITAXY

BACKGROUND OF THE INVENTION

The present invention relates to a device and a method for growing a semiconductor thin film by means of liquid-phase epitaxial growth on a semiconductor substrate, and more particularly to a device and a method for thin film epitaxial growth which enables a multi-layer thin film epitaxy on a substrate.

Epitaxy has taken importance as a manufacturing method for multi-layer thin film epitaxial layers of compound semiconductors such as Gallium Phosphide, GaP, Gallium Arsenide, GaAs, Indium Phosphide, InP, etc. for which slide processing has been widely used in the field. FIG. 1A shows schematically a cross-sectional diagram of an epitaxial growth system making use of the slide processing method as a typical example of liquid-phase epitaxy of prior art, and FIG. 1B shows the temperature distribution within an electric furnace.

Hereinafter, the liquid-phase epitaxy of prior art will be briefly described with its basic configuration, referring to an embodiment of Gallium Arsenide (GaAs). A boat shown in the FIG. 1A includes a movable substrate holder 3 which maintains substrates 5 and 6, a first melting liquid holder 7, a second melting liquid holder 8 on the substrate holder and a supporting plate 4 for the melting liquid holders. In case of growing a thin film gallium arsenide mixed compounds on the gallium arsenide substrate 5, metal substances and impurities are added in the melting liquid holders 7 and 8 in order to attain a thin-film epitaxial layer having a mixed crystal ratio, a conductivity type and an electric charge density which are prescribed. Then, in considering a configuration of growing P-type gallium aluminum arsenide GaAlAs on a P-type GaAs substrate for use in a light emitting diode (LED) and also growing N-type GaAs on the P-type GaAlAs, gallium (Ga) is used as a primary solvent material to which GaAs, Al and zinc (Zn) are added in a first melting liquid 9, and GaAs and tellurium (Te) are added in a second melting liquid 10. In the initial stage, the boat in which the substrate 5 rests is out of contact with the Ga melting liquid 9 and 10 and is inserted into a quartz tube 2 filled with the hydrogen ambient. The electric furnace 1 is driven to heat so that the temperature within the epitaxy system is invariably kept up in a range of 750° C. to 900° C. independent of any alteration of positions within the system, as illustrated in the temperature distribution diagram of FIG. 1B. By this heating the metal substances and impurities added to the Ga melting liquid 9 and 10 get melted enough. After enough melting of the metal substances and the impurities, the substrate holder 3 is slid out and the first melting liquid 9 comes to be in contact with the substrate 5. Then, as the temperature goes down slowly, a first-layer GaAlAs thin-film epitaxial growth is made. The substrate holder is again slid out and the second melting liquid 10 comes to be in contact with the substrate 5. By continuously decreasing the temperature, a second GaAs layer is grown in epitaxy. Termination of epitaxial growth can be made through sliding out the substrate holder 3 and mechanically removing the melting liquid 10 out of the substrate 5. The feature of the slide processing is to make thin-film epitaxial layers of different quality grow in sequence by using a plurality of melting liquids. However, in case that the first substrate 5 and the second substrate 6 are set in the holder 3 and the epitaxial growth of the two substrates is continuously made with said liquid-phase epitaxy, the temperature of the epitaxy system must be decreased during growth is the thin-film epitaxy by having the first substrate 5 be in contact with the first melting liquid 9. After the epitaxial growth of a first layer finishes, the first substrate 5 gets in touch with the second melting liquid 10 by means of sliding out the substrate holder and, at the same time, the second substrate 6 touches the first melting liquid 9. Because the second substrate 6 becomes to be in contact with the first melting liquid 9 under the environment of a temperature different from the temperature in the first layer epitaxy of the first substrate, a thin-film of very different quality from the first layer on the first substrate is formed in a first layer of the second substrate. Accordingly, the continuous epitaxial growths cannot be made in equal condition and on a plurality of substrates by means of the prior liquid-phase epitaxy. This fact lowers the yields of chips and also increases waste of raw material such as gallium. In addition to that, when ambient temperature is up to the growing temperature and is continuously kept up so that the material in the molten gallium is made into an saturated enough solution, the surfaces of the substrates are exposed to the hydrogen ambient of high temperature. By this reason, a heat dissolution reaction arises on the surface of the substrates and thereby it frequently results in an arsenic vacancy defect at the surface of the substrates.

SUMMARY OF THE INVENTION

It is therefore an object of the present invention to provide an improved device and method for liquid-phase epitaxy. It is another object to provide a device and method for a liquid-phase epitaxial growth of sliding type which enables the epitaxial growth of a plurality of substrates in an equal condition.

To achieve these and other objects of the invention, the liquid-phase epitaxial growing device comprises an auxiliary heating device installed in each melting liquid holder, by means of which liquid-phase epitaxy is carried out.

BRIEF DESCRIPTION OF THE DRAWINGS

The invention will be better understood with a reference to drawings, in which.

DETAILED DESCRIPTION OF THE INVENTION

Figure 1A:
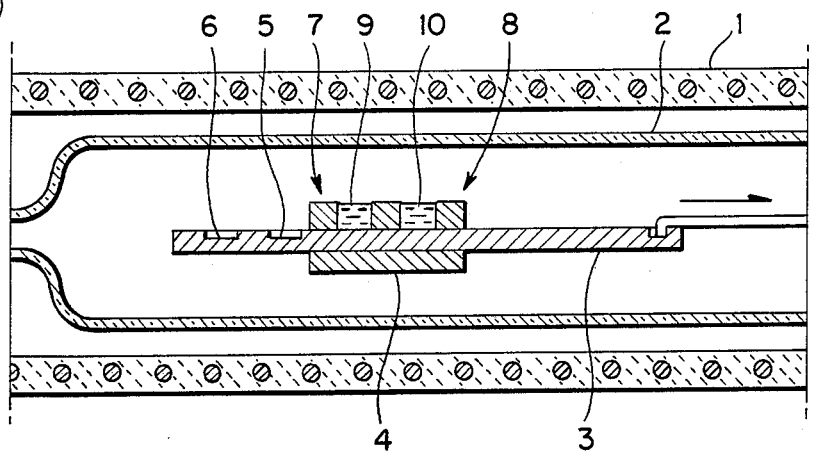
FIG. 1A is a schematic cross-sectional diagram of a device for a prior liquid-phase thin-film epitaxial growth of sliding type.
Figure 1B:
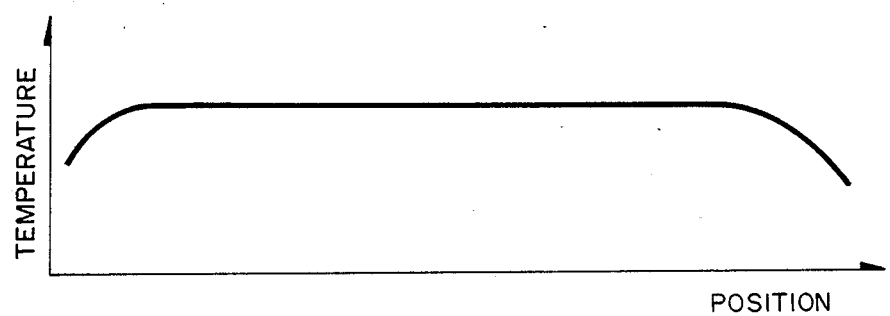
FIG. 1B is a temperature distribution diagram in an electric furnace.
Figure 2:
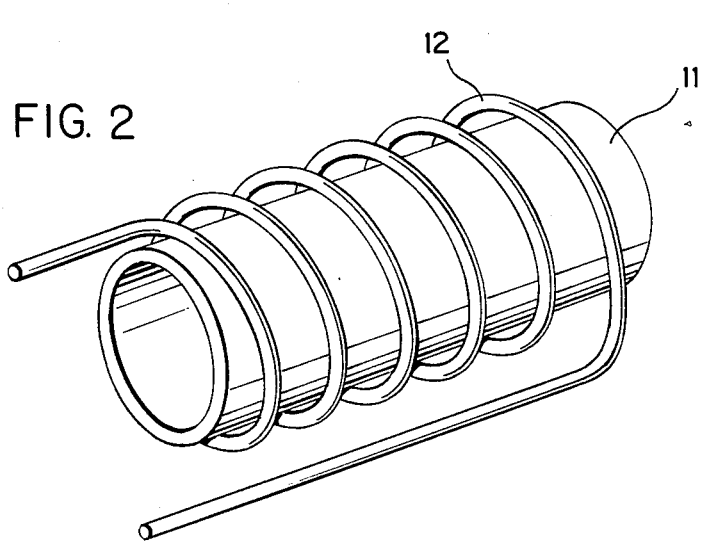
FIG. 2 is a schematic structural diagram of an auxiliary heating device showing a preferred embodiment in accordance with the invention.

Hereinafter, the invention will be described in detail with reference to the drawings. Referring to FIG. 2, showing a preferred embodiment of an auxiliary heating device to be installed in each melting liquid holder according to the invention, a quartz tube 11 is surrounded with a tungstenic heating coil 12. The auxiliary heating device is used to selectively heat and cool only a designated melting liquid in the liquid-phase epitaxy. FIG. 3A, 3C, 3E and 3G show each successive fabrication stage in the liquid-phase epitaxy and the device for use in the liquid-phase epitaxy according to the invention, comprising a plurality of auxiliary heaters and FIGS. 3B, 3D, 3F and 3H represent the temperature distribution in the reaction tube according to the method of the invention.

The liquid-phase epitaxial growing device of the invention comprises a substrate holder 23 which maintains semiconductor substrates 25 and 26 and is movable, a first melting liquid holder 27 on the substrate holder 23, a second melting liquid holder 28 on the same substrate holder, supporting plates 24 for separately supporting each melting liquid holder, a plurality of boats installed with auxiliary heating devices 31 and 32 which are adapted to respectively control the temperatures of a first melting liquid 29 and a second melting liquid 30, and a main heating furnace 21 for controlling the temperature of a quartz tube 22 and all the epitaxy system. To attain the best effect of the auxiliary heating device, each auxiliary heating device should be disposed at sufficient distance to not influence each other in heating. For inserting and moving the auxiliary heating devices and the boats into the quartz tube, a supporting plate is used, which is not shown in the figure, having identical material to the quartz tube and supporting both the auxiliary heating devices and the boats.

Now, it will be described in detail a preferred embodiment in which P-type GaAlAs is grown in epitaxy on a P-type GaAs substrate, that is the light emitting diode, and then N-type GaAs is grown in epitaxy on the above epitaxial growth. The melting liquid chiefly consists of gallium as a main solvent material, to which GaAs, Al and Zn are added in the first melting liquid 29 and GaAs and tellurium are added in the second melting liquid 30. FIG. 3A shows a fabrication stage for heating both the first melting liquid and the second melting liquid enough to melt down the impurities and metal materials added into the liquids. First, the boats and the auxilary heating devices are inserted into the hydrogen ambient quartz tube 22 and then the temperature of the main heating furnace 21 is kept by heating within a high temperature range 40 from 700° C. to 800° C. in order to make the reaction tube have a temperature distribution such as is shown in FIG. 3B. Also, by heating up the first auxiliary heater 31 and the second auxiliary heater 32, impurities in the melting liquids are made to be sufficiently melted in a high temperature range 41 from 750° C. to 900° C. The difference between the furnace 21 and the auxiliary heating devices 31 and 32 influences quality and thickness of a single crystal material to make the epitaxial growth. Because the epitaxy system has been already heated up by the electric furnace 21, only a small supply of electric power to the auxiliary heating devices is needed to attain sufficient difference.

Figure 3E:
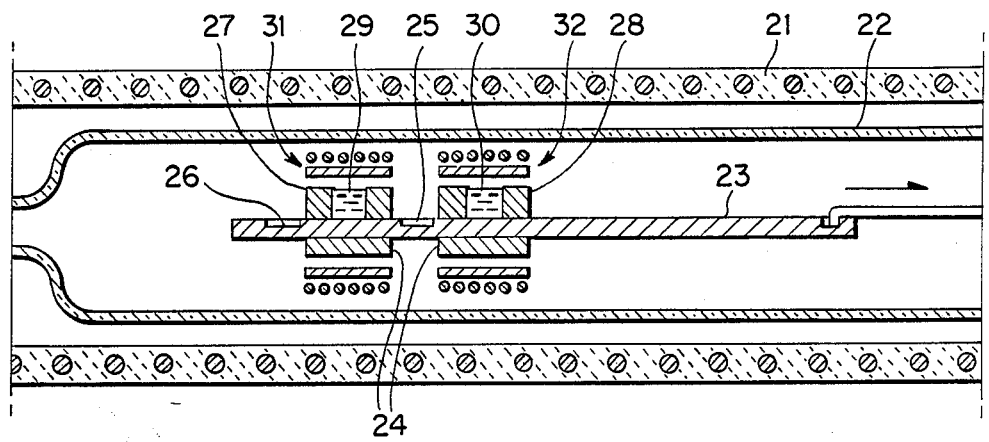
FIG. 3A to 3H show successive fabrication sequences in a liquid-phase thin-film epitaxy using a preferred embodiment in accordance with the invention and the temperature distributions therein.
Figure 3F:
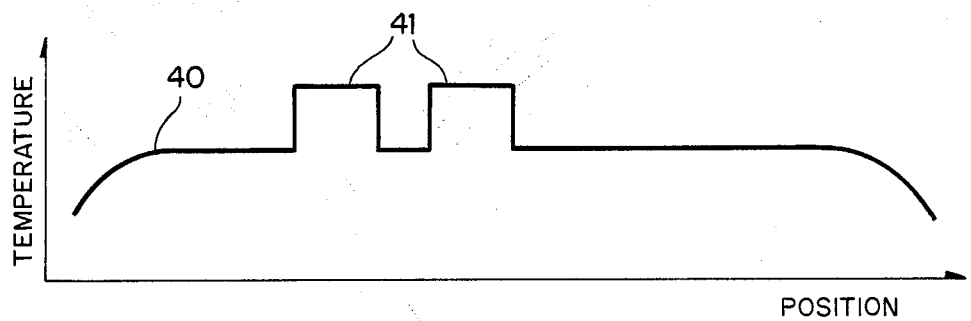
Figure 3G:
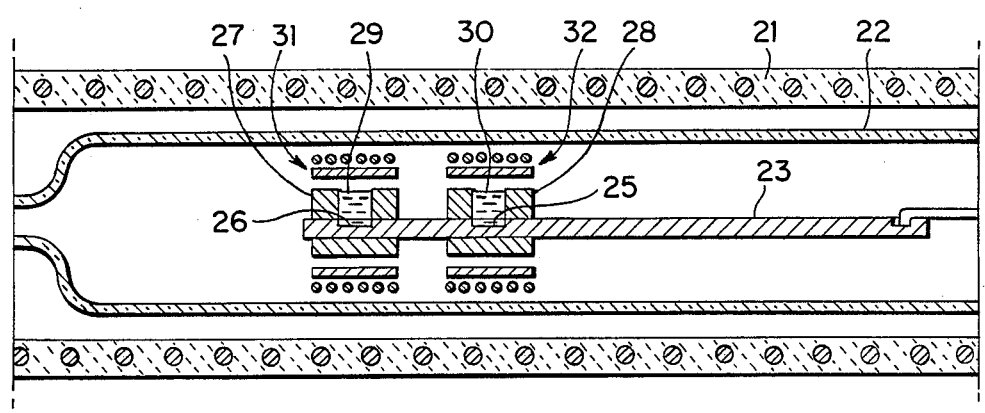
Figure 3H:
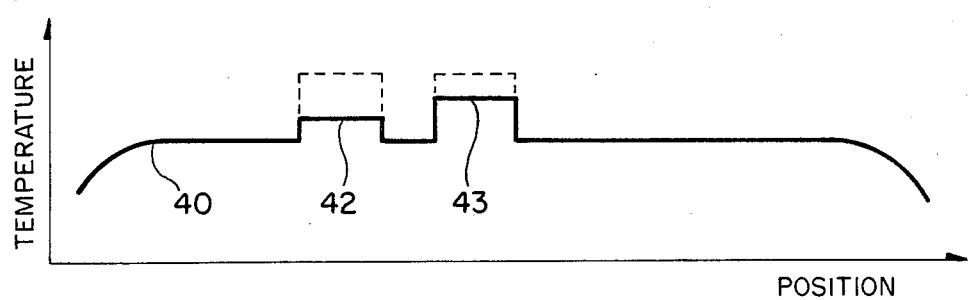
Figure 3A:
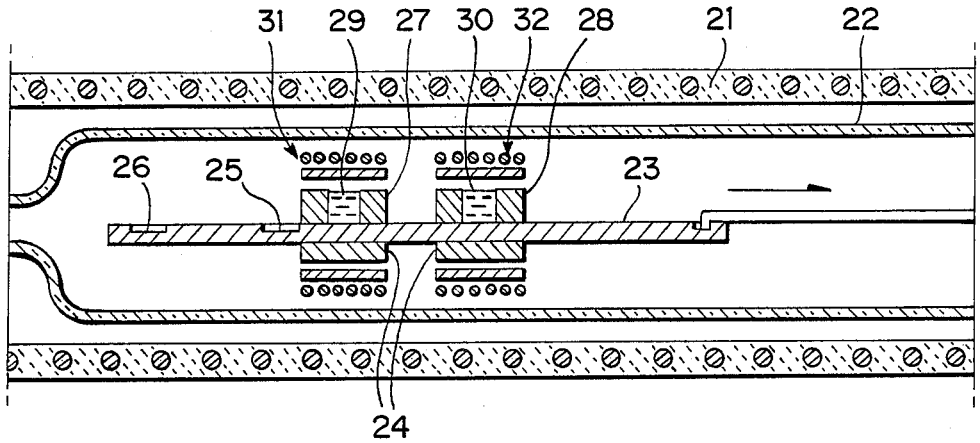
Figure 3B:
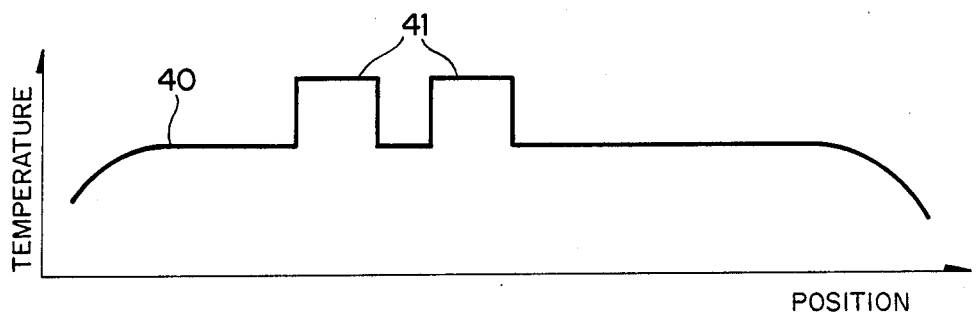
Figure 3C:
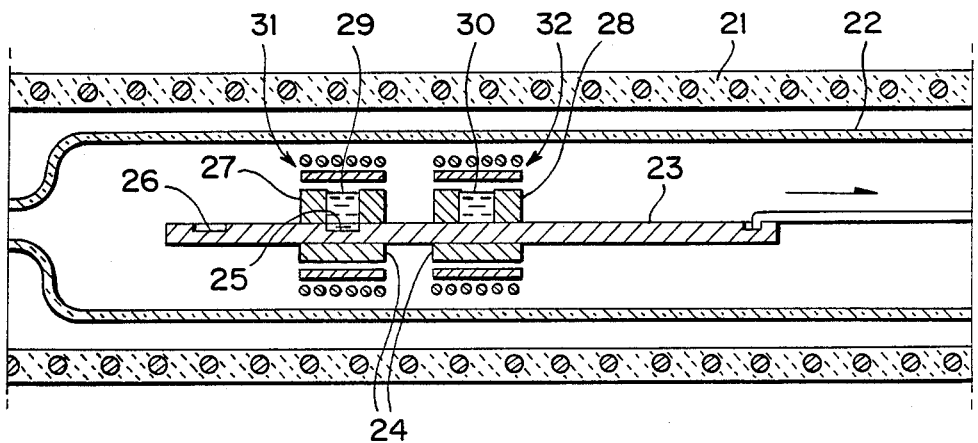
Figure 3D:
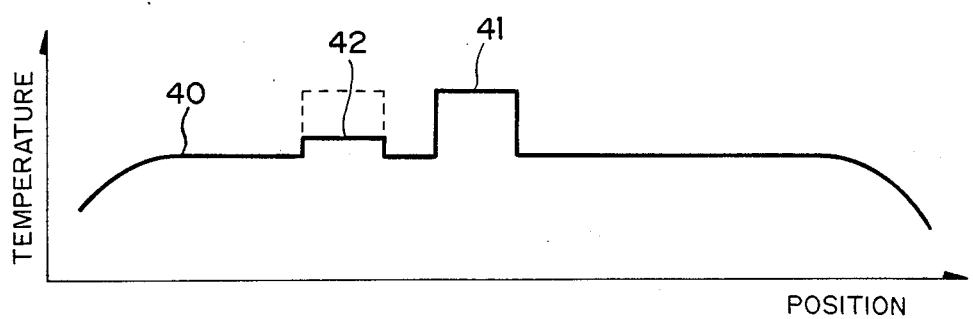

Referring to FIG. 3C, showing a fabrication stage in which the epitaxial growth of a first-layer GaAlAs single crystal is carried out on the substrate 25, the same substrate is placed to be in contact with the first melting liquid 27 by sliding the substrate holder 23, and during decreasing of the temperature of the first auxiliary heating device 31 the first-layer GaAlAs single crystal is made in epitaxy on the GaAs substrate 25. At this time, the first auxiliary heating device 31 is kept in a lower temperature level 42 than the level of 750° C. to 900° C., where its cooling speed depends upon the thickness of a GaAlAs single crystal layer which is intended in the epitaxy. On the other hand, the second auxiliary heating device 32 is still kept in the high temperature level 41 of 750° C. to 900° C. enough to melt down the impurities.

Referring to FIG. 3E, showing a fabrication stage which is a preliminary sequence prior to a second epitaxial growth after making the first-layer GaAlAs epitaxial growth on the substrate 25 with a designated thickness, the substrate holder 23 is slid out and the substrate 25 is separated from the first melting liquid 29. This makes the epitaxial growth stop and then the first auxiliary heating device 31 is heated up to reach the previous temperature level 41.

FIG. 3G shows a fabrication stage in which the second-layer GaAs epitaxial growth is carried out on the substrate surface of the first-layer GaAlAs epitaxy, and another GaAlAs epitaxial layer is grown on a new substrate 26 with the identical condition as the above-mentioned first-layer GaAlAs. Herein, by further sliding out the substrate holder 23, the first substrate 25 is disposed to be touch with the second melting liquid 30 and the second substrate 26 is simultaneously disposed to be in touch with the first melting liquid 29. After that, as the temperatures of both the first and second auxiliary heating devices 31, 32 are respectively lowered to the levels that are required to form a GaAlAs layer and a GaAs layer each having intended thickness in epitaxy, a second-layer GaAs single crystal is grown in epitaxy on the first substrate 25, and in the same time a first-layer GaAlAs single crystal is grown in epitaxy on the second substrate 26. Once a specified thickness of epitaxial growth is formed, the melting liquids are isolated from the substrates through further sliding the substrate holder 23, by which the epitaxial growth stops. Through these fabrication sequences, the first-layer GaAlAs epitaxial growth of the second substrate 26 becomes formable in the same condition as the first-layer epitaxy of the first substrate 25 and, after the second-layer GaAs epitaxial growth is carried out on the same first substrate 25 the epitaxy of the first substrate 25 is completed.

After heating up the auxiliary heating devices to the temperature of previous level 41, the substrate holder 23 is further slid out so that the second substrate 26 could in touch with the second melting liquid 30. Then, through reducing the temperature of the second auxiliary heating device, the second-layer GaAs epitaxial growth is carried out to a specified thickness. After the growth, by furthermore sliding out the substrate holder, the second substrate 26 and the second melting liquid are totally separated, by which the epitaxy of the second substrate 26 ends.

While the invention has been particularly shown and described with reference to a single preferred embodiment, it will be understood by those skilled in the art that modifications in detail may be made without departing from the spirit and scope of the invention by means of changing the forms, arrangements and numbers of melting liquid holders and substrates, and also changing the form and material of auxiliary heating devices and the manipulating method.

As having described hereinbefore, the invention makes it possible to have each melting liquid being cooled in different cooling speeds, and also have each melting liquid and substrate take a respective contacting interval by means of modifying positions of the substrates in designing the substrate holder, particularly in case that the first-layer epitaxial growing period differs from the second-layer epitaxial growing period. Accordingly, it becomes possible to carry out a liquid-phase epitaxial growth which consists of different thickness and quality through a single successive fabrication sequence, which eventually results in a better yield in production. Furthermore, an epitaxial growth layer of better quality may be attained by reducing a surface heat dissolution reaction in comparison with the prior art, because substrates waiting for growth epitaxy are kept at constant temperature and only the epitaxial growing portions are heated up to melting points.

What is claimed is:

1. A process of liquid-phase epitaxial growth of sliding boat type for forming a plurality of epitaxial layers on a plurality of substrates using a plurality of melting liquids in continuous fabrication steps, comprising the steps of:

heating an electric furnace to a first temperature level after inserting substrates mounted in boats and auxiliary heating devices each disposed around the boats and corresponding ones of a plurality of melting liquids, into a quartz reaction tube having a specified ambient temperature, and also heating both a first melting liquid and a second melting liquid to a second temperature level to make impurities melt by means of said auxiliary heating devices;

forming a first epitaxial layer on a first substrate by making said first substrate contact said first melting liquid by means of sliding said substrate holder and then cooling said first melting liquid to a third temperature level;

separating said first substrate from said first melting liquid by means of further sliding said substrate holder after forming a specified thickness of epitaxial growth on said first substrate, and again heating said first melting liquid to said second temperature level by said first auxiliary heating device;

making said first substrate contact the second melting liquid and said second substrate contact the first melting liquid by further sliding said substrate holder, and then cooling the first melting liquid to said third temperature level and the second melting liquid to a fourth temperature level, whereby a second expitaxial layer is formed on the first substrate and a first epitaxial layer is formed on the second substrate; and separating all the substrates from the melting liquids by further sliding the substrate holder.

2. The process of claim 1, further comprised of cooling the temperatures of said first and second melting liquids at rates depending upon thickness of said epitaxial layers being grown.

3. The process of claim 1, wherein said second temperature level is greater than said first temperature level and said third and fourth temperature levels are between said first and second temperature levels.

4. The process of claim 1, further comprised of:

making said second substrate contact the second melting liquid by further sliding the substrate holder and then cooling the second melting liquid to said fourth temperature level, whereby a second epitaxial layer is formed on the second substrate; and separating said second substrate from the second melting liquid by further sliding the substrate holder.

5. The process of claim 1, wherein one of said first and second melting liquids is a P-type alloy and the other of said first and second melts is an N-type alloy.

6. The process of claim 1, wherein one of said first and second melting liquids is an alloy of gallium aluminum arsenide and zinc while the other of said first and second melts is an alloy of gallium arsenide and a chalcogenide.

7. The process of claim 1, further comprised of reducing the temperatures of said auxiliary furnaces while growing said epitaxial layers at rates depending upon thicknesses of said epitaxial layers being grown.

8. A process of liquid-phase epitaxy, comprising:

heating a plurality of substrates mounted in boats within an interior of a main furnace by maintaining the main furnace at a first temperature level within a first temperature range of 700° to 800° C. while maintaining within said interior a first auxiliary furnace surrounding the boats and a first melt of gallium arsenide, aluminum and zinc and a second auxiliary furnace surrounding the boats and a second melt of gallium arsenide and a chalcogenide at a second temperature level within a second temperature range of 750° to 900° C.;

sliding one surface of a first one of said substrates into contact with said first melt to form a first epitaxial layer of gallium aluminum arsenide on the one surface of said first substrate while reducing the temperature of said first auxiliary furnace and maintaining said main furnace within said first temperature range and said second auxiliary furnace within said second temperature range;

sliding said one surface of said first one of said substrates from contact with said first melt and raising the temperature of said first auxiliary furnace to said second temperature level;

sliding said one surface of said first one of said substrates into contact with said second melt to form a second epitaxial layer of gallium arsenide on the one surface of said first substrate and sliding one surface of said second one of said substrates into contact with said first melt to form a first epitaxial layer of gallium aluminum arsenide on the one surface of said second substrate, while reducing the temperatures of said first and second auxiliary furnaces;

simultaneously sliding said one surface of said first substrate from contact with said second melt and sliding said one surface of said second substrate out of contact with said first melt and raising the temperature of said first and second auxiliary furnaces to said second temperature level;

sliding said one surface of said second one of said substrates into contact with said second melt to form a second epitaxial layer of gallium arsenide on the one surface of said second substrate while reducing the temperature of said second auxiliary furnace; and sliding said one surface of said second substrate out of contact with said second melt.

9. The process of claim 8, further comprised of reducing the temperatures of said first and second auxiliary furnaces to temperatures greater than said first temperature level and less than said second temperature level while forming said epitaxial layers.

10. The process of claim 9, further comprised of reducing the temperatures of said first and second auxiliary furnaces to different temperatures while forming said second epitaxial layer on the one surface of said first substrate and said first epitaxial layer on the one surface of said second substrate.

11. The process of claim 10, further comprised of reducing the temperatures of said auxiliary furnaces at rates depending upon thicknesses of said epitaxial layers being formed.

12. A process of liquid-phase epitaxy, comprising:
heating a plurality of substrates within the interior of a main furnace by maintaining the main furnace at a first temperature level within a first temperature range while maintaining within said interior a first auxiliary furnace surrounding a first semiconductor melt and a path of the substrates adjacent to the first semiconductor melt, and a second auxiliary furnace surrounding a second semiconductor melt and a path of the substrates adjacent to the second semiconductor melt, at second temperature levels within a second temperature range;
placing one surface of a first one of said substrates into contact with said first melt to form a first epitaxial layer on the one surface of said first substrate while reducing the temperature of said first auxiliary furnace;
removing said one surface of said first one of said substrates out of contact with said first melt and raising the temperature of said first auxiliary furnace to one of said second temperature levels;
placing said one surface of said first one of said substrates into contact with said second melt to form a second epitaxial layer on the first epitaxial layer of said first substrate and placing one surface of said second one of said substrates into contact with said first melt to form a first epitaxial layer on the one surface of said second substrate, while reducing the temperatures of said first and second auxiliary furnaces;
simultaneously removing said first and second substrates from contact with said first and second melts;
raising the temperatures of said first and second auxiliary furnaces to said second temperature levels;
placing said first epitaxial layer of said second substrate into contact with said second melt while reducing the temperature of said second auxiliary furnace; and
removing said second substrate from contact with said second melt.

13. The process of claim 12, further comprised of reducing the temperatures of said first and second auxiliary furnaces to temperatures greater than said first temperature level and less than said second temperature level while forming said epitaxial layers.

14. The process of claim 12, further comprised of reducing the temperatures of said first and second auxiliary furnaces to different temperatures while forming said second epitaxial layer on the one surface of said first substrate and said first epitaxial layer on the one surface of said second substrate.

15. The process of claim 14, further comprised of reducing the temperatures of said auxiliary furnaces at rates depending upon thicknesses of said epitaxial layers being formed.

16. The process of claim 12, further comprised of reducing the temperatures of said auxiliary furnaces at rates depending upon thicknesses of said epitaxial layers being formed.

17. The process of claim 12, further comprised of maintaining said main furnace at a constant temperature within said first temperature range while said substrates await formation of the epitaxial layers.

18. The process of claim 12, wherein one of said first and second semiconductor melts is a P-type alloy and the other of said first and second semiconductor melts is an N-type alloy.

19. The process of claim 12, wherein one of said first and second semiconductor melts is an alloy of gallium aluminum arsenide and zinc while the other of said first and second semiconductor melts is an alloy of gallium arsenide and a chalcogenide.

20. A process of liquid-phase epitaxy, comprising:
heating a main furnace having an interior capable of receiving a plurality of boats bearing semiconductor substrates and a plurality of semiconductor melts, to a first temperature level within a first temperature range while heating a plurality of auxiliary furnaces surrounding the boats and corresponding different ones of said semiconductor melts to second temperature levels within a second temperature range to maintain the corresponding ones of said semiconductor melts in molten states, said second temperature range being greater than said first temperature level;
placing a first one of said substrates into contact with a first one of said melts to form a first epitaxial layer on the first substrate while reducing the temperature of a corresponding auxiliary furnace to enable growth of said first epitaxial layer;
removing said first one of said substrates from contact with said first one of said melts and raising the temperature of the auxiliary furnace corresponding to said first one of said melts to said second temperature range;
forming one of a second epitaxial layer on a first epitaxial layer of said first substrate and a first epitaxial layer on said second substrate by placing one of said first epitaxial layer of said first substrate in contact with said second melt while reducing the temperature of said second auxiliary furnace to enable formation of a second epitaxial layer on said first epitaxial layer of said first substrate and one surface of said second substrate in contact with said first melt while reducing the temperature of said first auxiliary furnace to enable formation of a first epitaxial layer on said first substrate;
forming the other of said second epitaxial layer on said first epitaxial layer of said first substrate and the first epitaxial layer on said second substrate by placing the other of said first epitaxial layer of said first substrate in contact with said second melt while reducing the temperature of said second auxiliary furnace to enable formation of the second epitaxial layer on said first epitaxial layer of said first substrate and the one surface of said second substrate in contact with said first melt while reducing the temperature of said first auxiliary formation of the first epitaxial layer on said first substrate; and
removing said first and second substrates from contact with said first and second melts after formation of said first epitaxial layer on said first substrate.

21. The process of claim 20, further comprised of reducing the temperatures of said first and second auxiliary furnaces to temperatures greater than said first temperature level and less than said second temperature level while forming said epitaxial layers.

22. The process of claim 20, further comprised of reducing the temperatures of said first and second auxiliary furnaces to different temperatures while forming said second epitaxial layer on the one surface of said first substrate and said first epitaxial layer on the one surface of said second substrate.

23. The process of claim 22, further comprised of reducing the temperatures of said auxiliary furnaces at rates depending upon thicknesses of said epitaxial layers being formed.

24. The process of claim 20, further comprised of reducing the temperatures of said auxiliary furnaces at rates depending upon thicknesses of said epitaxial layers being formed.

25. The process of claim 20, further comprised of maintaining said main furnace at a constant temperature within said first temperature range while said substrates await formation of the epitaxial layers.

26. A process for liquid phase epitaxy, comprising:
maintaining an interior of a main furnace within a first temperature range;
heating within said interior, to a second temperature level within a second temperature range sufficient to make a first liquid melt of gallium arsenide, aluminum and zinc, said first melt and a first volume of said interior adjoining the first melt and occupied by successive ones of a plurality of substrates as the substrates travel along a path adjacent to the first melt through said interior, by using a first auxiliary furnace surrounding the first melt and the first volume;
forming a first epitaxial layer on a first substrate by sliding said first substrate into said first volume and contact with said first liquid melt and reducing said first melt to a third temperature level;
separating said first substrate from said first melt by sliding said first substrate from said first volume after forming said first epitaxial layer;
heating said first melt with said first auxiliary furnace to said second temperature level;
heating within said interior, to a fourth temperature level within said second temperature range sufficient to make a second liquid melt of gallium arsenide and a chalcogenide, said second melt and a second volume of said interior adjoining the second melt and occupied by successive ones of said plurality of substrates as the substrates travel along a path adjacent to the second melt through said interior, by using a second auxiliary furnace surrounding the second melt and the second volume; and
forming a second epitaxial layer on a first epitaxial layer of said first substrate and a first epitaxial layer on said second substrate, by sliding said first substrate into said second volume and contact with said second melt and reducing said second melt to a fifth temperature level, and by sliding said second substrate into said first volume and contact with said first melt and reducing said first melt to said third temperature level.

27. The process of claim 26, further comprised of making said third and fifth temperature levels different.

28. The process of claim 26, further comprised of maintaining said main furnace at a first temperature level within said first temperature range while making said third and fifth temperature levels greater than said first temperature level, with said third temperature level being less than said second temperature level and said fifth temperature level being less than said fourth temperature level.

29. The process of claim 28, further comprised of making said third and fifth temperature levels different.

30. The process of claim 28, further comprised of maintaining said first temperature level constant while forming said first epitaxial layers.

31. The process of claim 28, further comprised of making said third and fifth temperature levels different.

32. The process of claim 28, further comprised of maintaining said first temperature level constant while forming said first epitaxial layers.

33. The process of claim 26, further comprised of reducing said second and fourth temperature levels at rates depending upon thicknesses of said epitaxial levels being formed.

34. The process of claim 26, further comprised of making said third and fifth temperature levels different.

35. The process of claim 26, further comprised of maintaining said main furnace at a first temperature level within said first temperature range while making said third and fifth temperature levels greater than said first temperature level, with said third temperature level being less than said second temperature level and said fifth temperature level being less than said fourth temperature level.

36. The process of claim 26, further comprised of reducing said second and fourth temperature levels at rates depending upon thicknesses of said epitaxial levels being formed.

37. A process for liquid phase epitaxy, comprising:
maintaining an interior of a main furnace within a first temperature range;
heating within said interior, to a second temperature level within a second temperature range sufficient to make a first liquid melt of a semiconducting material and impurities, said first melt and a first volume of said interior adjoining the first melt and occupied by successive ones of a plurality of substrates as the substrates travel along a path adjacent to the first melt through said interior, by using a first auxiliary furnace surrounding the first melt and the first volume;
forming a first epitaxial layer on a first substrate by sliding said first substrate into said first volume and contact with said first liquid melt and reducing said first melt to a third temperature level;
separating said first substrate from said first melt by sliding said first substrate from said first volume after forming said first epitaxial layer;
heating said first melt with said first auxiliary furnace to said second temperature level;
heating within said interior, to a fourth temperature level within said second temperature range sufficient to make a second liquid melt of a semiconducting material and impurities, said second melt and a second volume of said interior adjoining the first melt and occupied by successive ones of a plurality of substrates as the substrates travel along a path adjacent to the first melt through said interior, by using a second auxiliary furnace surrounding the second melt and the second volume;
forming a second epitaxial layer on said first epitaxial layer of said first substrate and a first epitaxial layer on said second substrate, by sliding said first substrate into said second volume and contact with said second melt and reducing said second melt to a fifth temperature level, and by sliding a second substrate into said first volume and contact with said first melt and reducing said first melt to said third temperature level.

* * * * *